United States Patent
Okawa et al.

(10) Patent No.: US 6,771,887 B1
(45) Date of Patent: Aug. 3, 2004

(54) RECORDING/REPRODUCING APPARATUS AND RECORDING/REPRODUCING METHOD

(75) Inventors: Atsuko Okawa, Tokyo (JP); Shinjiro Akiha, Saitama (JP); Fumihiko Kato, Kanagawa (JP)

(73) Assignee: Sony Corporation, Tokyo (JP)

( * ) Notice: Subject to any disclaimer, the term of this patent is extended or adjusted under 35 U.S.C. 154(b) by 898 days.

(21) Appl. No.: 09/638,163

(22) Filed: Aug. 14, 2000

(30) Foreign Application Priority Data

Aug. 18, 1999  (JP) ........................................ P11-231288

(51) Int. Cl.[7] .............................................. H04N 5/91
(52) U.S. Cl. ...................... 386/83; 369/30.09; 386/68
(58) Field of Search ............................ 386/46, 68, 69, 386/70, 52, 55, 79, 80, 81, 82; 369/30.09

(56) References Cited

U.S. PATENT DOCUMENTS

| 5,748,576 A | * | 5/1998 | Kondo et al. ............. 369/30.09 |
| 6,088,304 A | * | 7/2000 | Aramaki et al. .......... 369/30.09 |
| 2003/0077559 A1 | * | 4/2003 | Braunberger et al. ....... 434/322 |

\* cited by examiner

*Primary Examiner*—Chris Kelley
*Assistant Examiner*—Alicia M. Duggins
(74) *Attorney, Agent, or Firm*—Jay H. Maioli (57) ABSTRACT

A recording/reproducing apparatus has a control unit in which a position to pause and a time to pause are set for data which has been recorded on a recording medium and is continuous with respect to time, and when a current position reaches the set pause position during the reproduction of the data, the reproduction of the data is paused for the set pause period of time.

25 Claims, 11 Drawing Sheets

RECORDING/REPRODUCING APPARATUS AND RECORDING/REPRODUCING METHOD

BACKGROUND OF THE INVENTION

1. Field of the Invention

The invention relates to a recording/reproducing apparatus and a recording/reproducing method, in which a reproduction of data which has been recorded on a recording medium and is continuous with respect to time is temporarily stopped on the basis of pause information set by the user and the pause information set by the user is recorded onto the recording medium.

2. Description of the Related Art

To learn a foreign language, it is necessary for a learner to repetitively hear the pronunciation of a native instructor or to record his own pronunciation and repetitively confirm whether it is correctly pronounced or not. As a recording/reproducing medium which is used as a learning material at the time of hearing the pronunciation of the instructor or recording his own pronunciation and learning the foreign language as mentioned above, a compact cassette tape has widely been used hitherto. However, according to the compact cassette tape, an access speed is low and the fast-forward operation or the rewinding operation of the tape has to be frequently repeated in order to repetitively hear and learn the pronunciation of the instructor. According to the compact cassette tape, a high sound quality cannot be obtained.

A CD (Compact Disc) (registered trademark) is, therefore, used to learn a foreign language. According to the CD, an access speed is remarkably high, a higher sound quality is also obtained, and a mass production can be easily performed as compared with the tape. Learning materials for learning of a foreign language using a CD, therefore, have already widely been sold.

An MD (Mini Disc) (registered trademark) is also suitable to learn a foreign language. The recording and reproduction can be performed in the MD. Therefore, if the MD is used, it is possible to repetitively record and confirm his own pronunciation. Since the MD is small-sized and can be easily carried, if the MD is used, a foreign language can be learned on the way to office or school or the like by carrying a small MD recording/reproducing apparatus.

Further, in recent years, a memory card which is detachable from the main body is being developed. An audio recording/reproducing apparatus using a memory card has been proposed. An extension memory is a card-shaped recording medium having therein, for example, an NAND type flash memory. Since an audio recording/reproducing apparatus using such an extension memory has a high access speed and can be very easily handled, it is considered that the memory card will be widely used for learning a foreign language in future.

In the learning materials for learning of a foreign language using a recording medium such as compact cassette, CD, MD, extension memory, or the like as mentioned above, a silent time is provided for allowing the learner to pronounce subsequently to a word or phrase which is pronounced by the instructor or practice a conversation. The silent time has an important meaning.

For example, in a practice of pronunciation "This is a pen", after the instructor pronounced "This is a pen", the learner mimics the pronunciation of the instructor and pronounces "This is a pen" for the silent time. This is the reason why a period of a few seconds after the instructor pronounced "This is a pen" becomes a silent time. The silent time is hitherto a mere blanking interval.

As mentioned above, in the learning of a foreign language, the silent time has the important meaning. The time necessary as a silent time and a position to be made silent differ in dependence on an interest, a learning level, or the like of the learner, respectively. For example, a necessary silent time for the experienced learner and that for the beginner are different. Although a skilled learner can pronounce even for a short silent time, the beginner needs a long silent time.

For example, for the learner who well knows a phrase "This is a pen", since it is unnecessary to train this phrase, the subsequent silent time is unnecessary. If he newly finds an important expression, by setting the subsequent time to the silent time, he can repetitively learn such an important expression.

As mentioned above, to learn a foreign language, it is demanded that a duration of the silent time and the setup and deletion of the silent time can be freely performed.

As mentioned above, a compact cassette tape, a CD, an MD, an extension memory, or the like is used as a recording medium for learning of a foreign language. However, in any case, the silent time is a mere blanking interval. It is, therefore, not easy to change the position or duration of the silent time.

That is, to provide the silent time, it is necessary to manually pause or form a silent time and rerecord.

Since the silent time is a blanking interval, if a long silent time is provided, a recording capacity is vainly consumed.

OBJECTS AND SUMMARY OF THE INVENTION

It is an object of the invention to provide a recording/reproducing apparatus for reproducing main data which has been recorded on a recording medium and is continuous with respect to time, comprising:

reproducing means for reproducing the main data recorded on the recording medium;

first operating means for allowing the user to set pause position information showing a position to pause the reproduction of the main data and pause time information showing a continuation time to pause at the pause position;

pause information forming means for forming the pause position information and the pause time information on the basis of an operation of the first operating means;

pause information recording means for recording the pause position information and the pause time information onto the recording medium;

timer means for counting a time to stop the reproduction of the main data; and control means for controlling the pause information recording means so as to record the pause position information and the pause time information formed by the pause information forming means on the basis of the operation of the first operating means onto the recording medium, controlling the timer means so as to count the continuation time to pause on the basis of the pause time information on the basis of the position which is being reproduced by the reproducing means and the pause position information; and controlling the reproducing means so as to pause the reproduction of the main data for a period of time during which the timer means is counting the pause time.

Another object of the invention is to provide a recording/reproducing method of reproducing main data which has-been recorded on a recording medium and is continuous with respect to time, comprising the steps of:

forming pause position information showing a position to pause the reproduction of the main data on the basis of an operation of the user;

forming a time to pause the reproduction of the main data at the position shown by the formed pause position information as pause time information on the basis of an operation of the user;

storing the formed pause position information and pause time information onto the recording medium; and reproducing the main data and pausing the reproduction of the main data for a predetermined period of time on the basis of the pause position information and the pause time information recorded on the recording medium.

The above and other objects and features of the present invention will become apparent from the following detailed description and the appended claims with reference to the accompanying drawings.

DETAILED DESCRIPTION OF THE PREFERRED EMBODIMENTS

Figure 1:
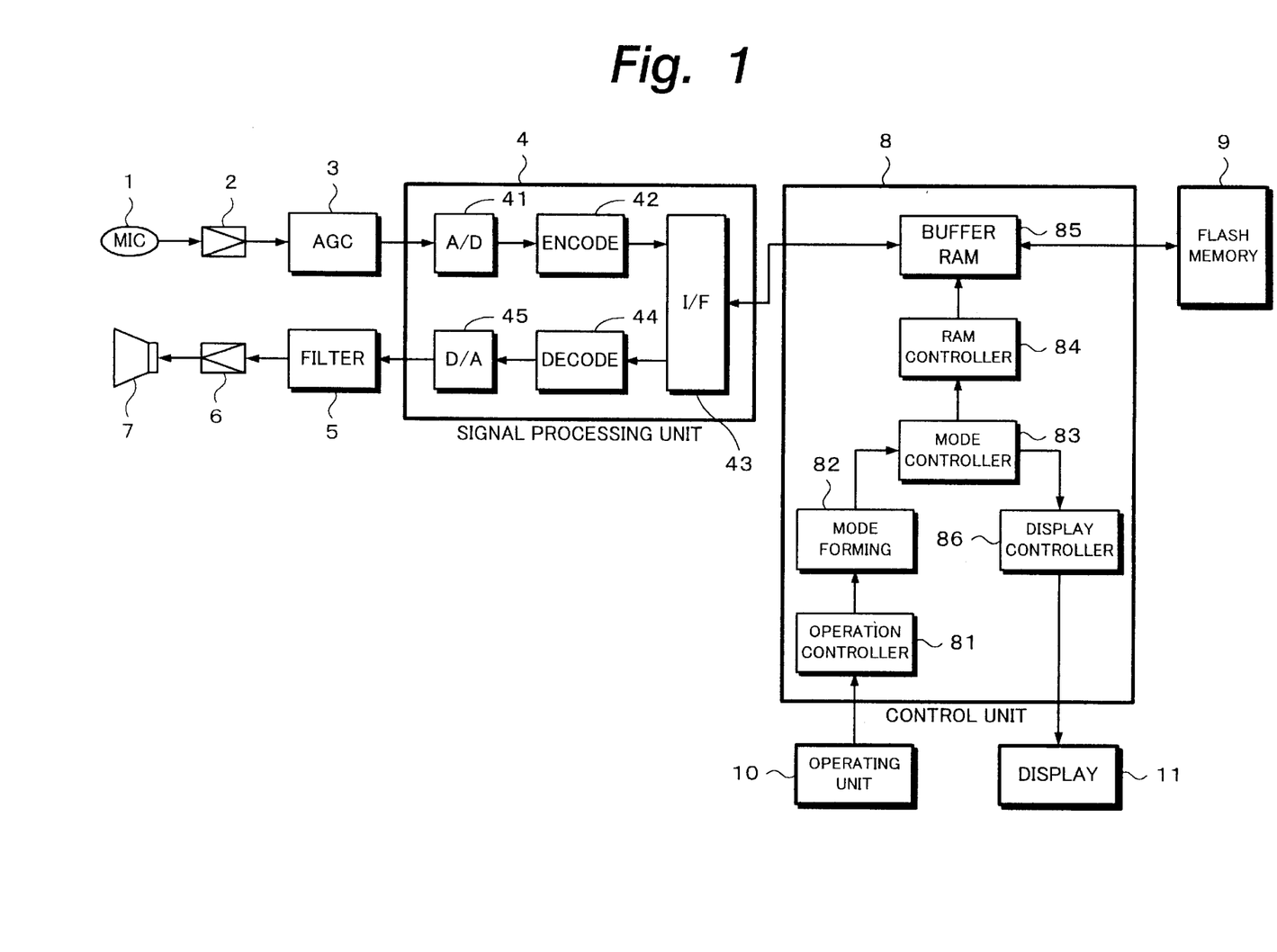
FIG. 1 is a block diagram showing a whole construction of an embodiment of the invention.

An embodiment of the invention will now be described hereinbelow with reference to the drawings. FIG. 1 shows a whole construction of the embodiment of the invention. The embodiment is suitable for learning a language by using an extension memory.

As shown in FIG. 1, a recording/reproducing apparatus according to the invention comprises: a microphone 1; two amplifiers 2 and 6; an AGC (Auto Gain Control) circuit 3; a signal processing unit 4; a filter circuit 5; a speaker 7; a control unit 8; a flash memory 9; an operating unit 10; and a display unit 11.

First, a construction and the operation of a recording system will be simply explained. An audio signal inputted through the microphone 1 is amplified by the amplifier 2. An amplification output is gain controlled by the AGC circuit 3 and supplied to the signal processing unit 4. The signal processing unit 4 comprises: an A/D converter 41; an encoding circuit 42; an interface circuit 43; a decoding circuit 44; and a D/A converter 45.

The audio signal which was gain controlled by the AGC circuit 3 is supplied to the A/D converter 41. In the A/D converter 41, the audio signal is sampled and quantized and converted into a digital audio signal. The digital audio signal is supplied to the encoding circuit 42 and compressed.

For example, ADPCM (Adaptive Differential Pulse Code Modulation) is used as a compression system of the audio signal. Another compression encoding method such as MPEG (Motion Picture Experts Group) audio, ATRAC (Adaptive Transform Acoustic Coding), or the like can be also used as a compression system of the audio signal.

Audio data formed by compressing and modulating processes is supplied to the control unit 8 via the interface circuit 43. The control unit 8 comprises: an operation control unit 81; a mode forming unit 82; a mode control unit 83; an RAM control unit 84; a buffer RAM 85; a display control unit 86; and the like.

For example, the control unit 8 is constructed by mainly a microcomputer having an internal memory and the like. Portions other than the buffer RAM 85 can be realized by software processes.

The buffer RAM 85 is controlled by control information from the RAM control unit 84 and the audio data transmitted via the interface circuit 43 is temporarily stored in the buffer RAM 85. The audio data temporarily stored in the buffer RAM 85 is read out and written into the extension memory 9.

The extension memory 9 is, for example, detachable from the main body through a connector or the like and is electrically connected to the control unit 8 when it is loaded. The extension memory 9 can be also solely built in the apparatus.

A construction and the operation of a reproducing system will now be simply described. The audio data at a desired reproducing position read out from the extension memory 9 is temporarily stored in the buffer RAM 85. The audio data temporarily stored in the buffer RAM 85 is read out and supplied to the decoding circuit 44 through the interface circuit 43 of the signal processing unit 4.

In the decoding circuit 44, a decompressing process is performed to the audio data, so that the digital audio signal is reconstructed. That is, a reverse conversion of the compressing and modulating processes performed in the encoding circuit 42 of the recording system is performed.

The digital audio signal reconstructed by the decoding circuit 44 is supplied to the D/A converter 45 and converted into an analog reproduction audio signal. The reproduction audio signal formed in the D/A converter 45 is supplied to the filter circuit 5 and band limited. After that, it is amplified through the amplifier 6. The amplified reproduction audio signal is supplied to the speaker 7 and an audio sound is reproduced.

The operating unit 10 in which various operation buttons are arranged and the display unit 11 having a display device such as a liquid crystal display panel or the like are provided for the control unit 8. The control unit 8 manages the whole apparatus in accordance with an operation state of the operating unit 10.

Specifically speaking, when the various operation keys of the operating unit 10 are operated, an operation output according to the state of each operated key is generated from the operating unit 10 and supplied to the operation control unit. 81. The operation control unit 81 forms detection information on the basis of the operation output and supplies the detection information to the mode forming unit 82. In the mode forming unit 82, mode information to control the whole apparatus is formed and supplied to the mode control unit 83. The mode control unit 83 controls the buffer RAM 85 through the RAM control unit 84 on the basis of the mode information, thereby controlling the transmission and reception of the audio data. The mode control unit 83 forms the display information on the basis of the mode information and supplies it to the display control unit 86. In the display control unit 86, a display output according to the display information is formed and supplied to the display unit 11 and a corresponding image is displayed.

The recording/reproducing apparatus according to the invention has an auto pause function. The auto pause function is used to provide a silent portion of a desired length at a desired position.

When the auto pause function is used, a flag is set to a position serving as a silent portion. Upon reproduction, a process to detect the flag is performed. When the flag is detected upon reproduction, the reproduction is paused in this portion, so that a silent portion is formed at the position where the flag has been set. As will be explained hereinlater, this flag is written in a redundant area of an NAND type flash memory constructing the extension memory.

Figure 2:
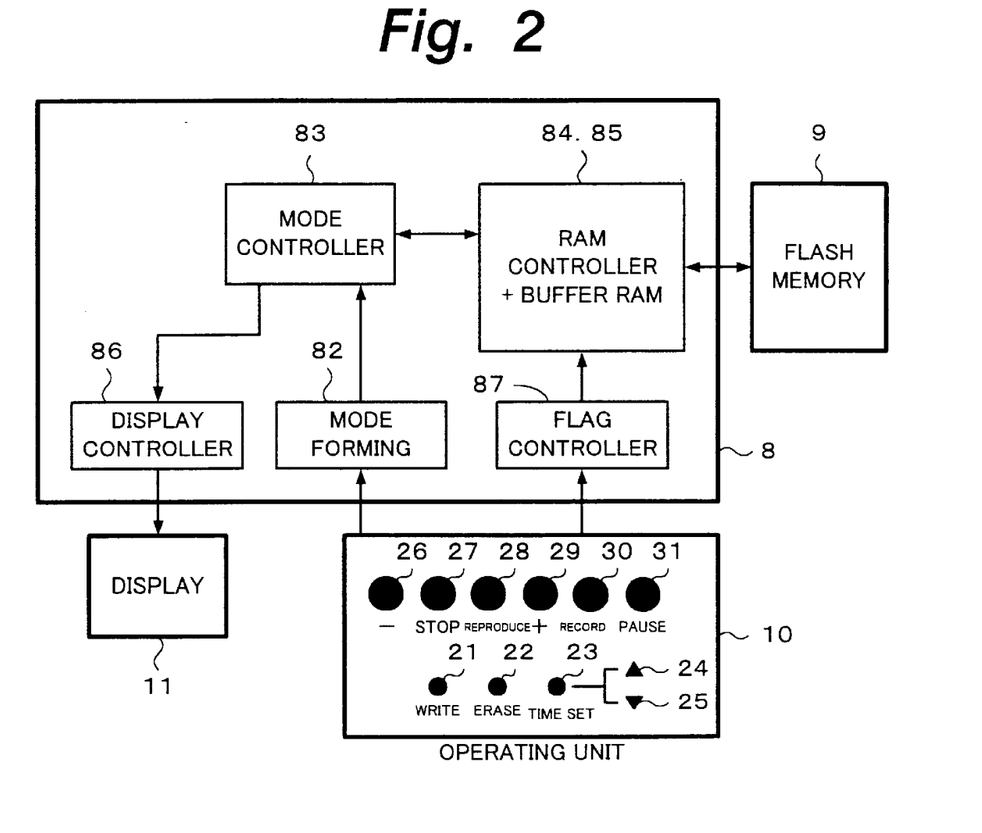
FIG. 2 is a block diagram showing a construction of a main section in the embodiment of the invention.

FIG. 2 shows an example of a specific construction of a main section to realize the auto pause function. In FIG. 2, the portions corresponding to those in FIG. 1 mentioned above are designated by the same reference numerals and the detailed descriptions regarding the same portions are omitted here.

As shown in FIG. 2, a group of buttons 21 to 25 regarding the auto pause function are arranged in the operating unit 10 and a group of buttons 26 to 31 regarding the recording and reproducing operations are arranged in the operating unit 10. Among the group of buttons 21 to 25 regarding the auto pause function, reference numeral 21 denotes a write button which is used when the pause information is written; 22 an erase button which is used when the pause information is erased; and 23, 24, and 25 set buttons which are used when a pause time is set, respectively.

Among the group of buttons 26 to 31 regarding the recording and reproducing operations, reference numeral 26 denotes a back button to move back the recording and reproducing positions; 29 a forward button of the recording/reproducing position; 30 a record button; 28 a reproduce button; 27 a stop button; and 31 a pause button.

When one of the group of buttons 26 to 31 regarding the recording and reproducing operations is pressed, mode information according to the pressed button is formed in the mode forming unit 82. The mode control unit 83 controls the buffer RAM 85 via the RAM control unit 84 on the basis of the mode information and performs various operations according to the pressed buttons for the extension memory 9. The display information according to the operating state is formed by the mode control unit 83 and a predetermined display is performed in the display unit 11.

When a predetermined operation is performed in response to the write button 21 of the auto pause function, information indicative of the presence or absence of the pause information is formed in the flag control unit 87 at this timing. The information formed in the flag control unit 87 is supplied to the RAM control unit 84. Thus, the pause information is written at a predetermined reproducing position in the extension memory 9.

When a predetermined operation is performed in response to the erase button 22 of the auto pause function, information which is located in the back direction in the reproducing direction on the time base from the current reproducing position as for the timing of the predetermined operation and used to erase the closest pause information is formed in the flag control unit 87. The information formed in the flag control unit 87 is supplied to the RAM control unit 84. Thus, the pause information written at the predetermined reproducing position in the extension memory 9 is erased.

For example, when the set button 23 of the pause time is pressed, the apparatus is set to the set mode of the pause time, the pause time increases in accordance with the depression time of the button 24 in this state, and the pause time is reduced in accordance with the time of depression of the button 25.

Figure 3:
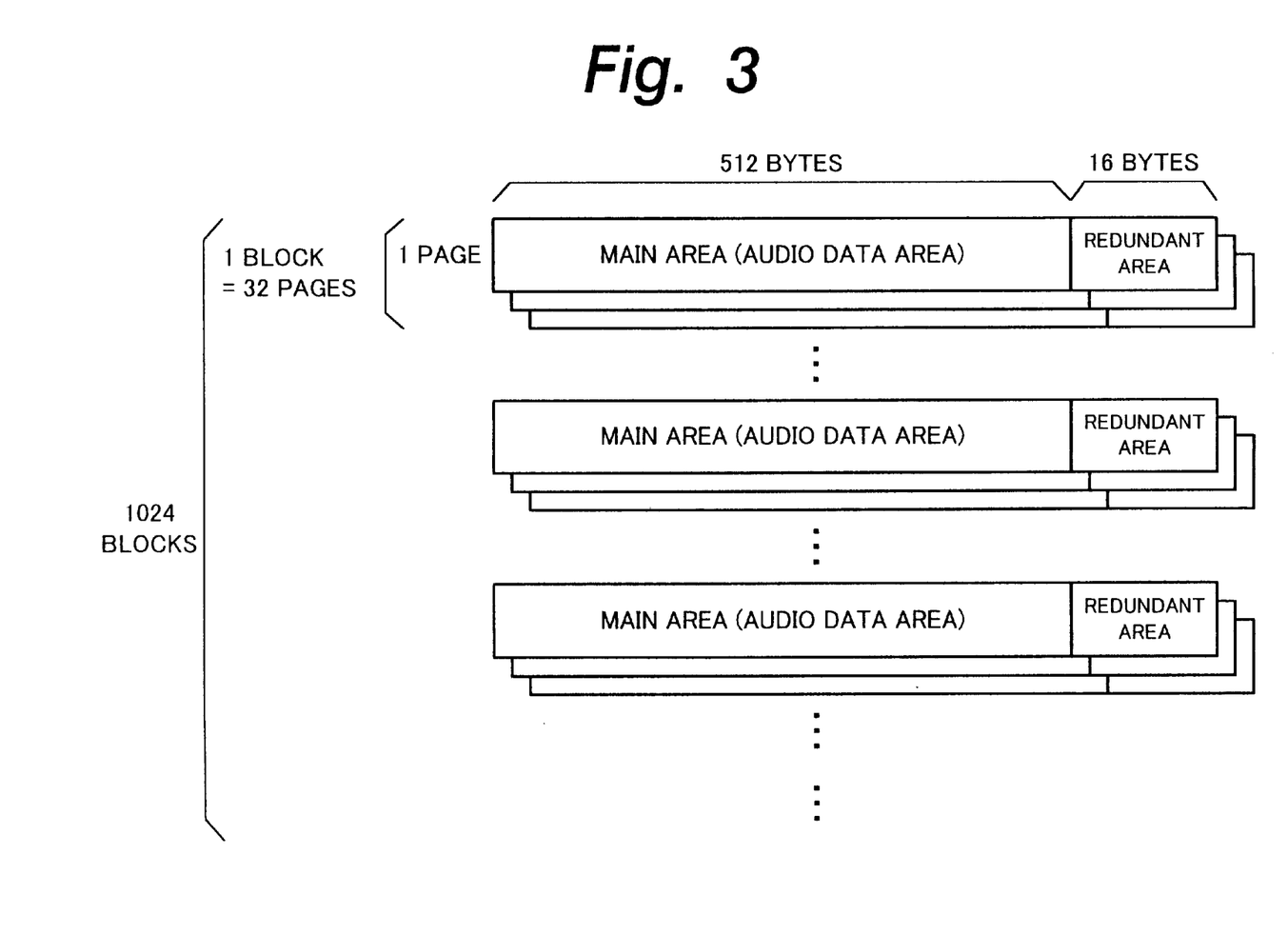
FIG. 3 is an explanatory diagram of an area division of a memory which is used for explanation of the embodiment of the invention.

FIG. 3 shows an example of a conceptual construction of a memory area in case of using an NAND type flash memory of 16 Mbytes as an extension memory 9. As shown in FIG. 3, the whole memory area in the extension memory 9 is divided into 1024 blocks and each block is divided into 32 pages. One page is constructed by a main area 91 of 512 bytes and a redundant area 92 of 16 bytes. The audio data is written and read out into/from the main area 91. The pause information is written and erased into/from the redundant area 92.

Figure 4A:
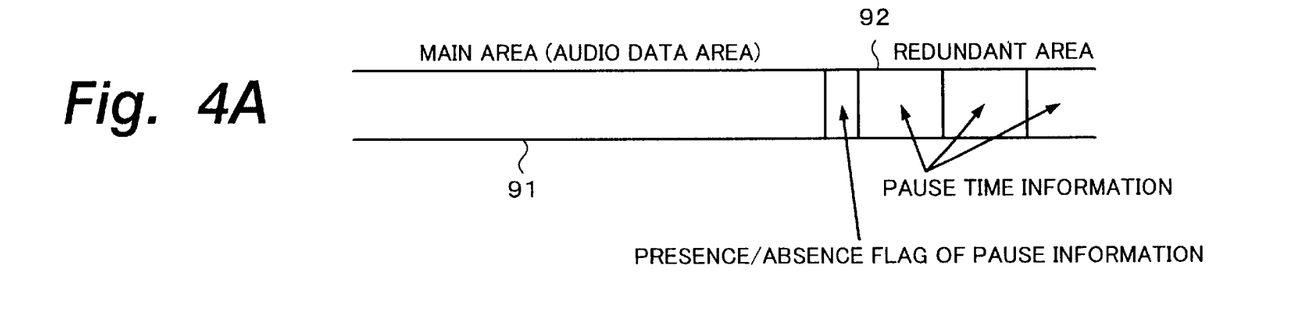
FIG. 4A is a diagram for use in explanation of the first embodiment of pause information in the embodiment of the invention.

The pause information which is written in the redundant area 92 is constructed by, for example, a flag indicative of the presence or absence of the pause information and the pause time information as shown in FIG. 4A. The flag indicative of the presence or absence of the pause information is arranged at the head position of the redundant area 92 and the pause time information set by the set buttons 23, 24, and 25 is arranged at the next position.

The pause information in such a form is set to an arbitrary reproducing position by the user during the operation of the recording, reproduction, or the like. Upon reproduction, the audio data in the main area 91 and the pause information in the redundant area 92 are read out every page in accordance with a predetermined order and sequentially accumulated in the buffer memory 85. In this instance, the mode control unit 83 monitors the flag indicative of the presence or absence of the pause information, automatically pauses the reproducing operation only by the time corresponding to the value shown by the pause time information at a point when the pause information is detected, and restarts the reproduction after the elapse of a predetermined time.

Figure 4B:
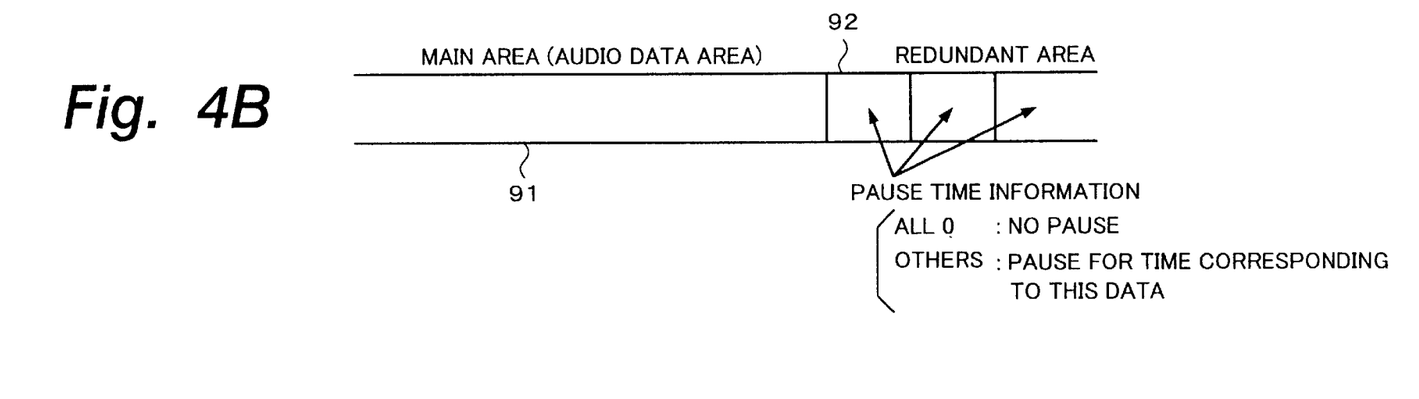
FIG. 4B is a diagram for use in explanation of the second embodiment of pause information in the embodiment of the invention.

FIG. 4A shows an example in the case where the flag indicative of the presence or absence of the pause information and the pause time information are used as pause information. However, as shown in FIG. 4B, the auto pause function can be also realized by using only the pause time information as pause information. In this case, when the value shown by the pause time information is equal to a predetermined value, the pause is not executed. In the other cases, the pause is executed for the time corresponding to the value shown by the pause time information. Specifically speaking, a similar process can be executed by constructing in such a manner that when all of the values shown by the pause time information are equal to "0", the pause is not executed and when there is no need to pause, all "0" is written into the redundant area 92.

Figure 5:
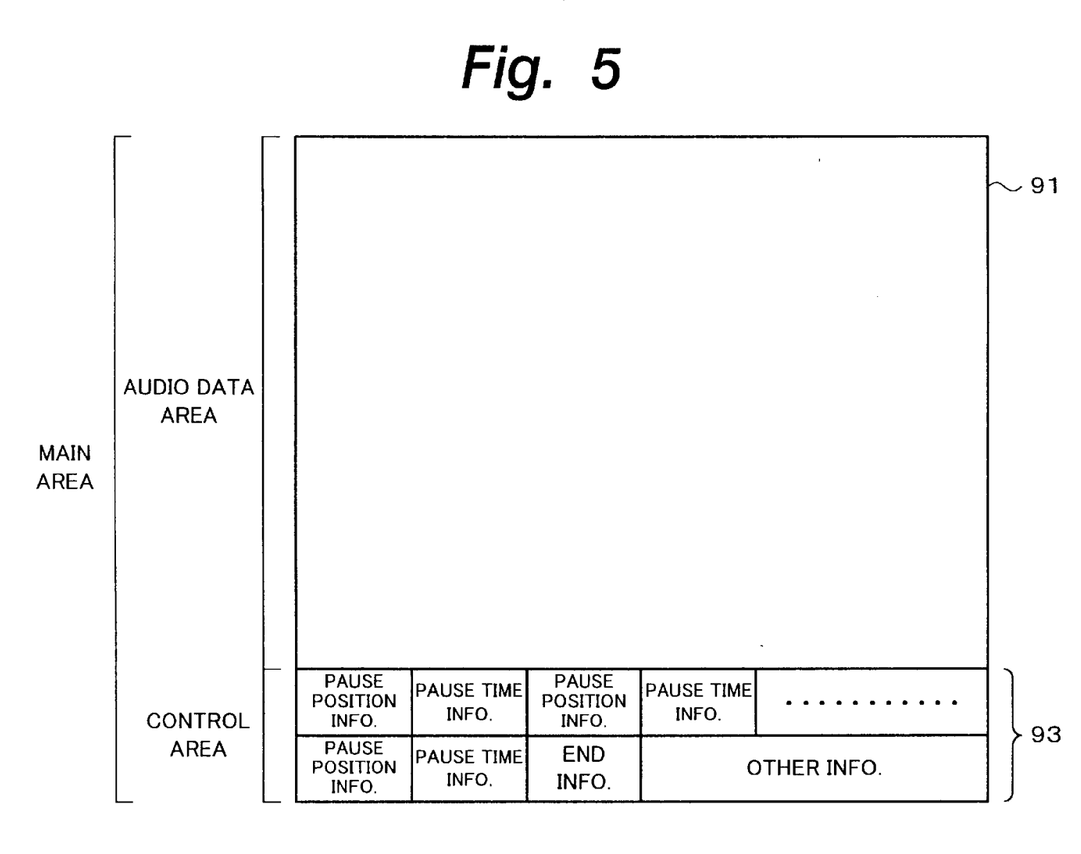
FIG. 5 is a diagram for use in explanation of the third embodiment of pause information in the embodiment of the invention.

Although both FIGS. 4A and 4B relate to the examples in case of writing the pause information into the redundant area 92, as shown in FIG. 5, it is also possible to divide the main area 91, use a part thereof as a control area 93, and write the pause information into the control area 93.

In this case, a pair of pause position information and pause time information are used as pause information and position comparing means for discriminating whether the reproducing position of the audio data has reached the position shown by the pause position information or not is provided. Only in the case where it is determined by position comparing means that the reproducing position of the audio data has reached the position shown by the pause position information, the pause is executed only for the time corresponding to the value shown by the pause time information. At this time, it is also possible to construct in such a manner that even if it is determined that the reproducing position has reached the position shown by the pause position information, the pause is not executed when the value shown by the pause time information is equal to a predetermined value.

Further, in the case where the main area 91 is divided, a part thereof is used as a control area 93, and the pause information is written into the control area 93, to distinguish from the other control information, as shown in FIG. 5, it is also possible to write fixed data as end information indicative of the end of an information group to the ends of all pause information, set the end information to a boundary, and arrange the pause information into the area locating before the boundary.

Figure 6A:
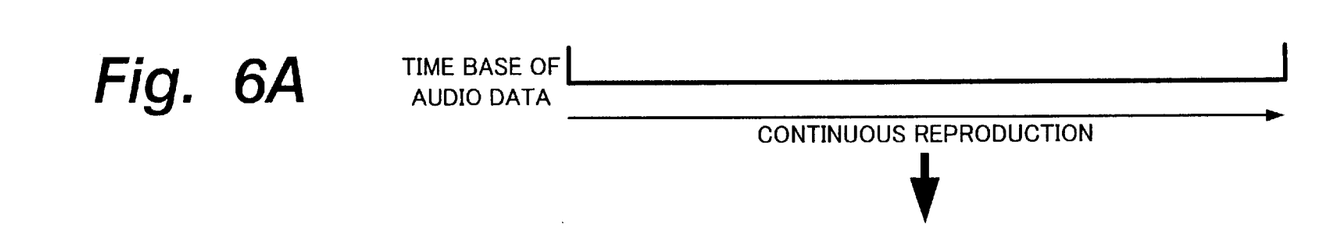
FIG. 6A is a diagram for use in explanation of the operation in a state where there is no pause information in the explanation of the writing operation and erasing operation of pause information in the invention.
Figure 6B:
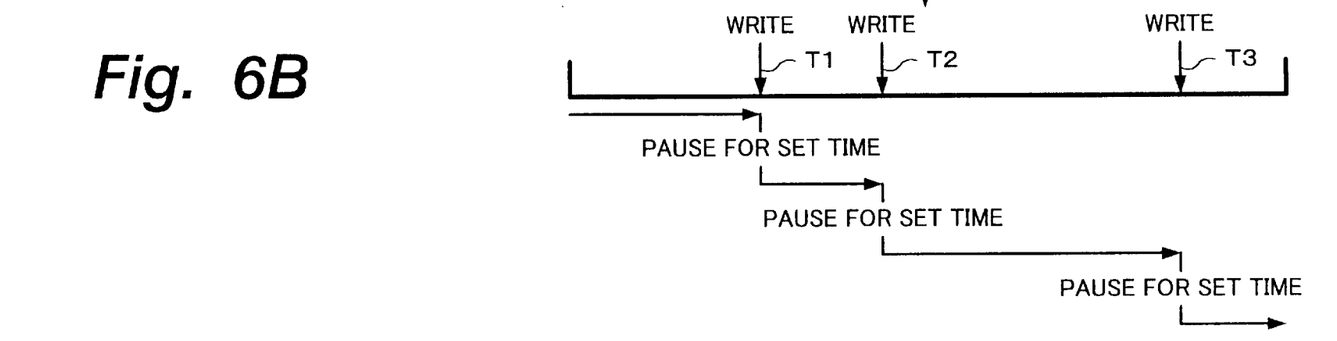
FIG. 6B is a diagram for use in explanation of the operation to write the pause information in the explanation of the writing operation and erasing operation of pause information in the invention.
Figure 6C:
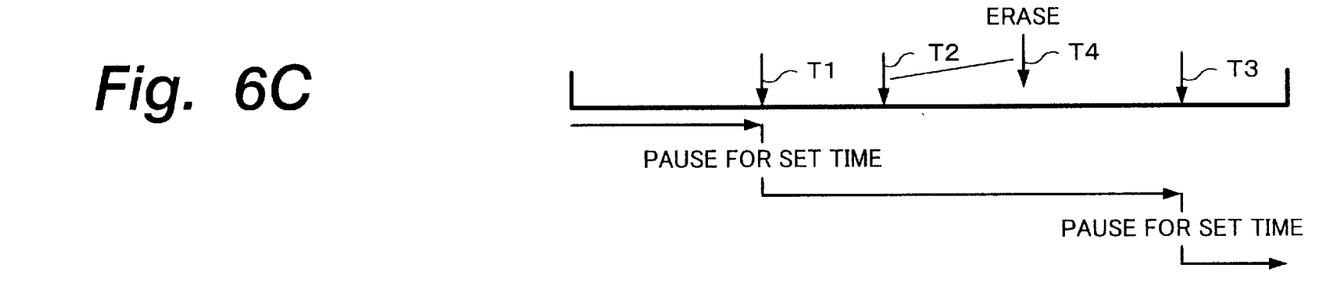
FIG. 6C is a diagram for use in explanation of the operation to erase the pause information in the explanation of the writing operation and erasing operation of pause information in the invention.

FIGS. 6A, 6B, and 6C show specific examples of the writing, erasing, and reproducing operations of the pause information mentioned above. The writing, erasing, and reproducing operations of the pause information will be further described in detail with reference to FIGS. 6A to 6C. In FIGS. 6A to 6C, it is assumed that the time elapses from the left side to the right side in the diagram.

When the pause information is not written to any position during the operation of the recording, reproduction, or the like, if it is reproduced, the continuous reproduction is performed as shown in FIG. 6A. On the other hand, when the pause information is written during the operation of the recording, reproduction, pause, or the like, the apparatus enters a pause mode at the position where the pause information has been written in the subsequent reproducing operation and restarts the reproduction after the elapse of a time which has previously and arbitrarily been set.

For example, as shown in FIG. 6B, when predetermined operations are performed at timings T1, T2, and T3 in response to the operation of the write button 21 of the auto pause function, the pause information is written in the redundant area 92 at the timings T1, T2, and T3. When the reproducing position is returned to the head and the reproduce button 28 is pressed, the audio data is sequentially read out and reproduced. When the current time reaches each of the timings T1, T2, and T3, the apparatus automatically enters the pause mode without operating the pause button 31 and restarts the reproduction after the elapse of a time which has previously and arbitrarily been set.

In the case where the pause information has already been written as shown in FIG. 6B, if a predetermined operation is performed at timing T4 in response to the operation of the erase button 22 of the auto pause function, as shown in FIG. 6C, the pause information which is located in the back direction in the reproducing direction on the time base for the timing T4 and has been written at the closest timing T2 is erased. Therefore, when the reproducing position is returned to the head and the reproduce button 28 is pressed, the audio data is sequentially read out and reproduced. Only when the current time reaches each of the timings T1 and T3, the apparatus automatically enters the pause mode without operating the pause button 31 and restarts the reproduction after the elapse of a time which has previously and arbitrarily been set in a manner similar to that mentioned above.

Naturally, since the pause information has already been erased at timing T2, the apparatus does not enter the pause mode.

Figure 7:
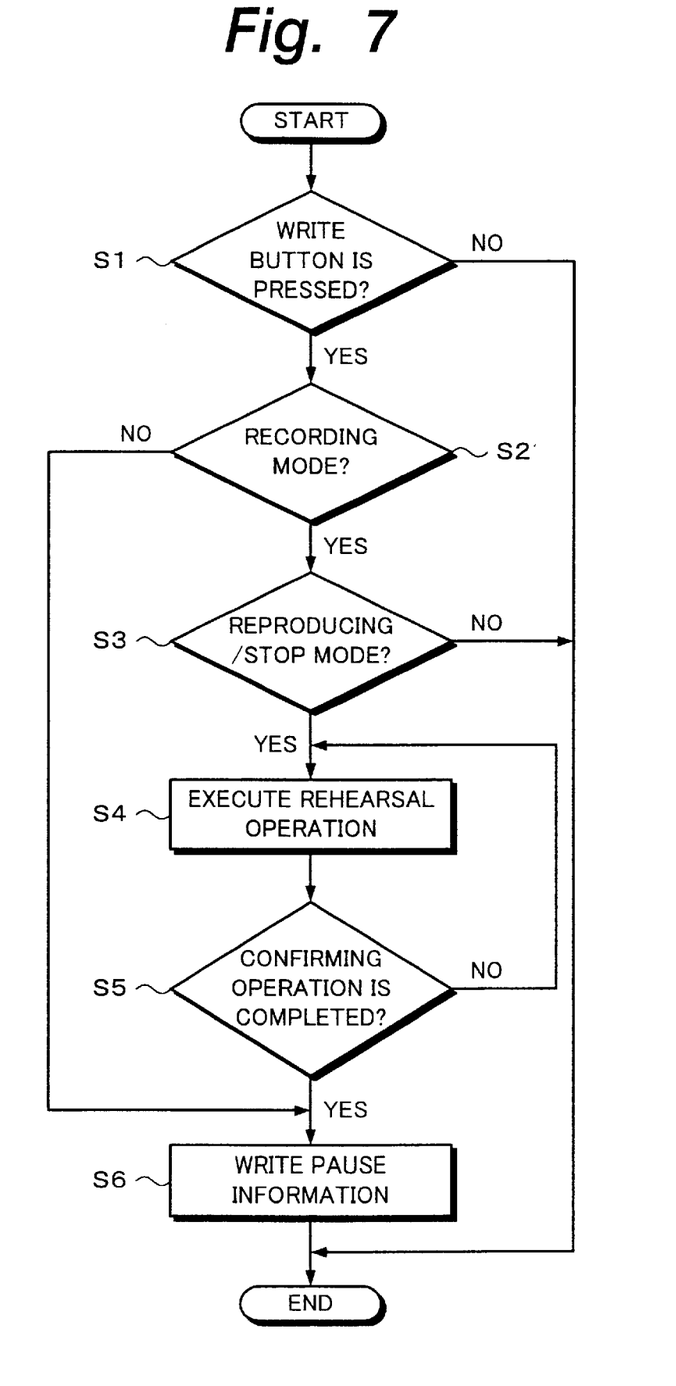
FIG. 7 is a flowchart for use in explanation of the operation to write the pause information in the invention.

FIG. 7 shows an example of a processing procedure regarding the writing operation of the pause information mentioned above. First, in step S1 whether the write button 21 has been pressed or not is discriminated. If it is determined that the write button 21 has been pressed, step S2 follows and whether the operating mode is the recording mode or not is discriminated.

If it is determined in step S2 that the operating mode is the recording mode, step S6 follows. The pause information is written into the redundant area 92 at a predetermined reproducing position and the processes are finished. If it is decided in step S1 that the write button 21 is not pressed, the processing routine is finished as it is. If it is determined in step S2 that the operating mode is not the recording mode, step S3 follows and whether the operating mode is the reproducing/stop mode or not is discriminated.

If it is decided in step S3 that the operating mode is not the reproducing/stop mode but another forward/reverse mode, the processing routine is finished as it is. If it is decided in step S3 that the operating mode is the reproducing/stop mode, step S4 follows and the rehearsal operation is executed. In the rehearsal operation, the reproduction for a predetermined interval or time, for example, 3 seconds in which the position where the write button 21 was pressed is set to a start point is repeated.

Figure 8A:
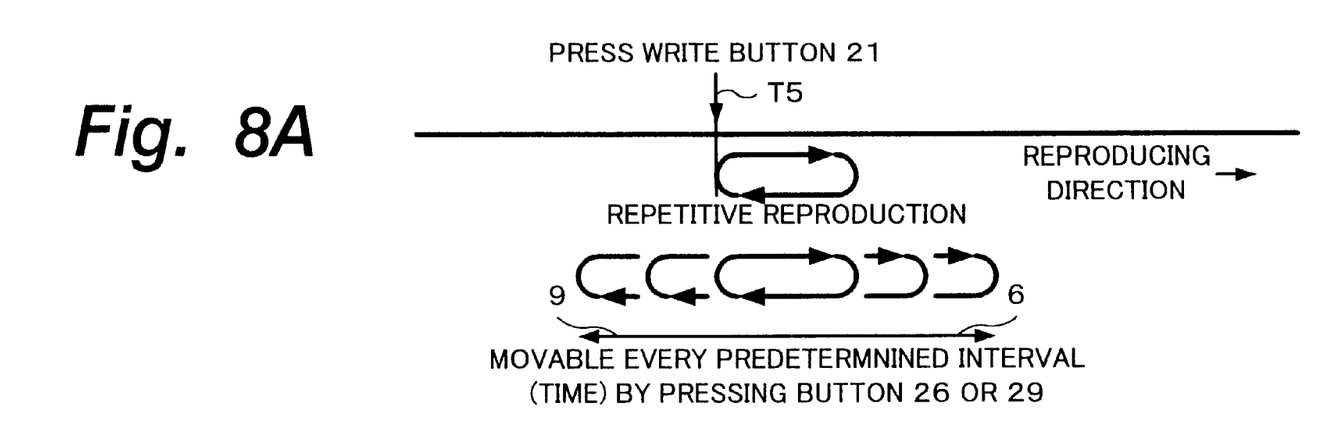
FIG. 8A is a schematic diagram for use in explanation of the operation for a peripheral repetitive reproduction at the time of writing of the pause information in the invention.

FIG. 8A schematically shows the rehearsal operation. In FIG. 8A, it is assumed that the time elapses from the left side to the right side in the diagram. For example, assuming that the write button 21 is pressed at timing T5 during the reproducing or stop operation as shown in FIG. 8A, the reproduction is repetitively performed while setting the reproducing position to a start point. In this instance, for example, by pressing the back button 26, the current position can be moved in the back direction in the reproducing direction from the reproducing position corresponding to the first timing T5 as shown by an arrow (a) in the diagram every predetermined interval or time, for example, 0.3 second. By pressing the forward button 29, the current position can be moved in the reproducing direction from the reproducing position corresponding to the first timing T5 as shown by an arrow (b) in the diagram every predetermined interval or time, for example, 0.3 second.

Figure 8B:
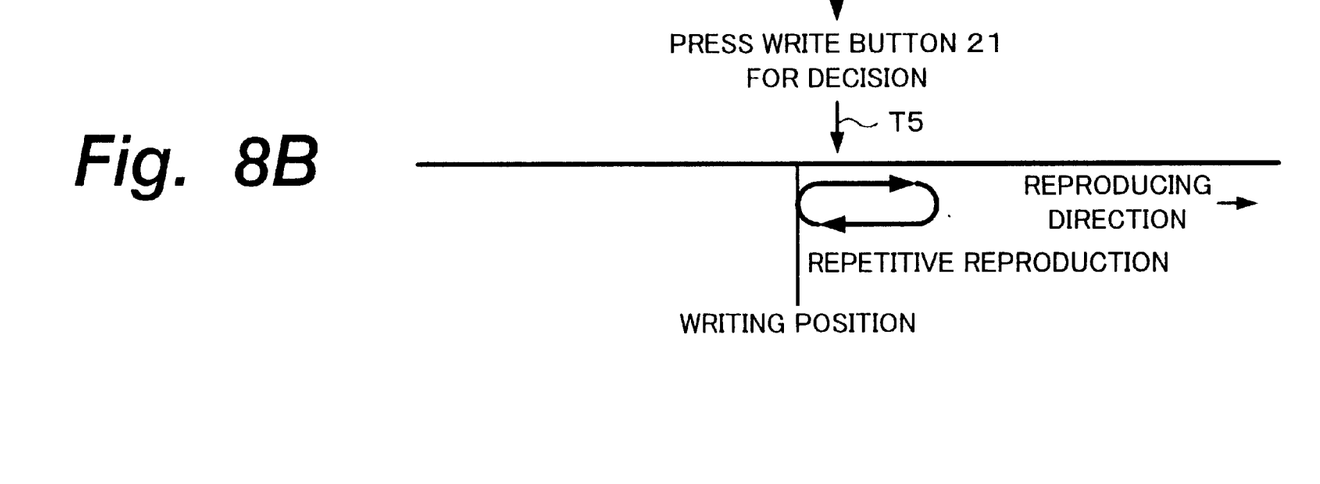
FIG. 8B is a schematic diagram for use in explanation of the operation to decide a pause position in the invention.

When the rehearsal operation is performed, whether the deciding operation has been performed or not is discriminated in step S5. When it is determined that the deciding operation is not performed, the processing routine is returned to step S4 and the rehearsal operation is repetitively performed. A writing position of the pause information is confirmed by the user with the back button 26 and forward button 29 pressed. In this state, when the write button 21 is again pressed as a deciding operation as shown in FIG. 8B, for example, the processing routine advances to step S6. The pause information is written into the redundant area 92 at a predetermined reproducing position and the processing routine is finished. By performing the rehearsal operation, the correcting operation of the writing position of the pause information is easily performed.

Although the case of deciding the writing position by again pressing the write button at the time of the rehearsal operation has been described above, it is also possible to separately provide a dedicated button for decision and decide the writing position of the pause information by pressing such a button.

Although the case of automatically performing the rehearsal operation in the reproducing or stop mode has been described above, it is also possible to separately provide a dedicated button for the rehearsal operation and repeat the reproduction for a predetermined interval or time, for example, 3 seconds in which the position where the write button 21 has been pressed is set to a start point only when such a button is pressed.

Figure 9:
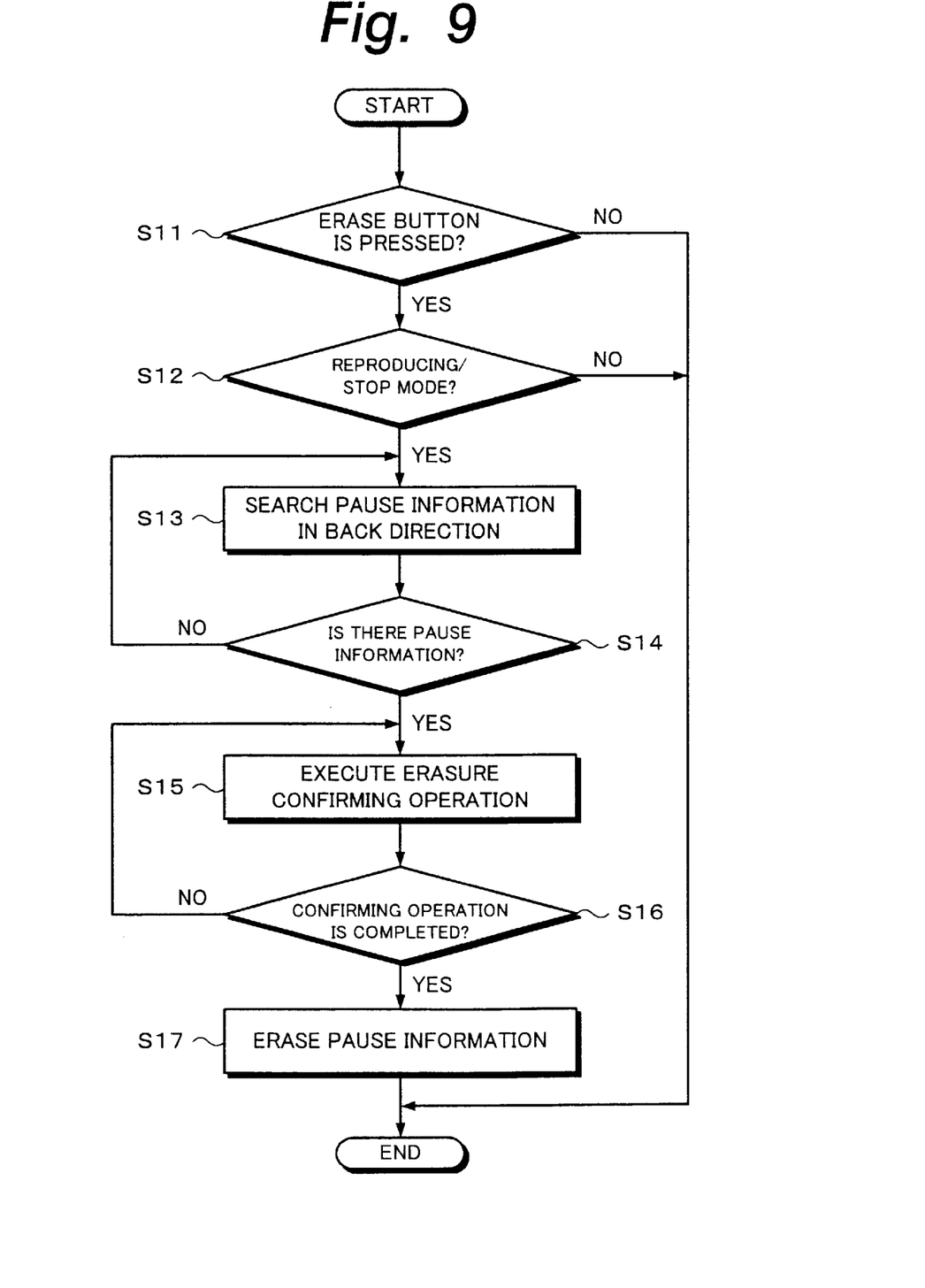
FIG. 9 is a flowchart for use in explanation of the operation to erase the pause information in the invention.

FIG. 9 shows an example of a processing procedure regarding the erasure of the pause information mentioned above. First, in step S11, whether the erase button 22 has been pressed or not is discriminated. When it is determined that the erase button 22 was pressed, step S12 follows and whether the operating mode is the reproducing/stop mode or not is discriminated.

If it is determined in step S12 that it is the reproducing mode or the stop mode, step S13 follows. The pause information which is located in the back direction in the reproducing direction on the time base for the timing when the erase button 22 is pressed and has been written at the closest timing is searched. In step S14, the presence or absence of the pause information is discriminated. When it is determined that there is no pause information, the processing routine is returned to step S13 and the search of the pause information is continued.

Only when it is decided that there is the pause information in step S14, step S15 follows and the erasure confirming operation is executed. In the erasure confirming operation, the reproduction is repeated for a predetermined interval or time, for example, 3 seconds in which the position where the pause information as a target of erasure has been written is set to a start point.

Figure 10:
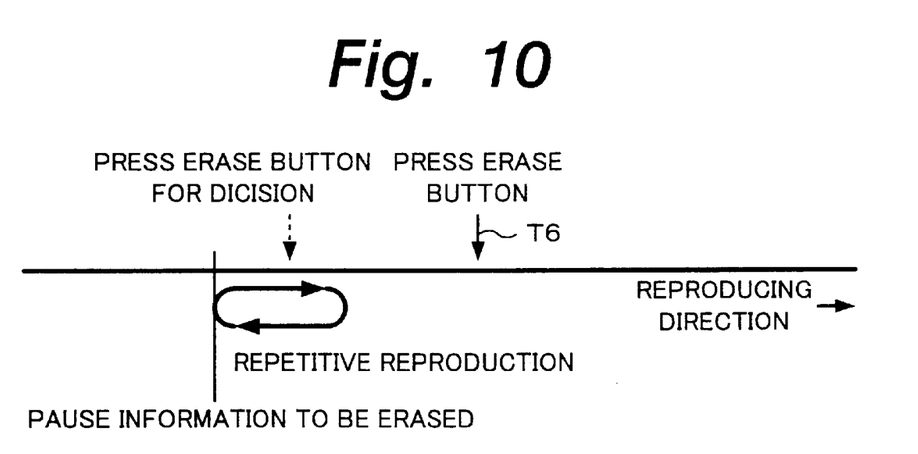
FIG. 10 is a schematic diagram for use in explanation of the operation to decide the erasure of the pause information in the invention.

FIG. 10 schematically shows the erasure confirming operation. In FIG. 10, it is assumed that the time elapses from the left side toward the right side in the diagram. For example, assuming that the erase button 22 was pressed at timing T6 during the reproducing or stop operation as shown in FIG. 10, the reproduction is repetitively performed as shown in FIG. 10 while the reproducing position of the pause information which is located in the back direction in the reproducing direction on the time base for the timing T6 and has been written at the closest timing is set to a start point.

When the erasure confirming operation is performed, whether the deciding operation has been performed or not is discriminated in step S16. When it is determined that the deciding operation is not performed, the processing routine is returned to step S15 and the erasure confirming operation is repetitively performed. The position of the pause information as a target of erasure is confirmed by the user. When the erase button 22 is again pressed as a deciding operation as shown in FIG. 10 in this state, for example, the processing routine advances to step S17. The pause information is erased in the redundant area 92 at a predetermined reproducing position and the processing routine is finished. The pause information is certainly erased by performing the erasure confirming operation. If it is determined in step S11 that the erase button 22 is not pressed or if it is decided in step S12 that the operating mode is other than the reproducing/stop mode, the processing routine is finished as it is.

Although the case where the pause information to be erased is decided by again pressing the erase button 22 at the time of the erasure confirming operation has been described in the above example, it is also possible to separately provide a dedicated button for decision and erase the pause information by pressing such a button.

Figure 11:
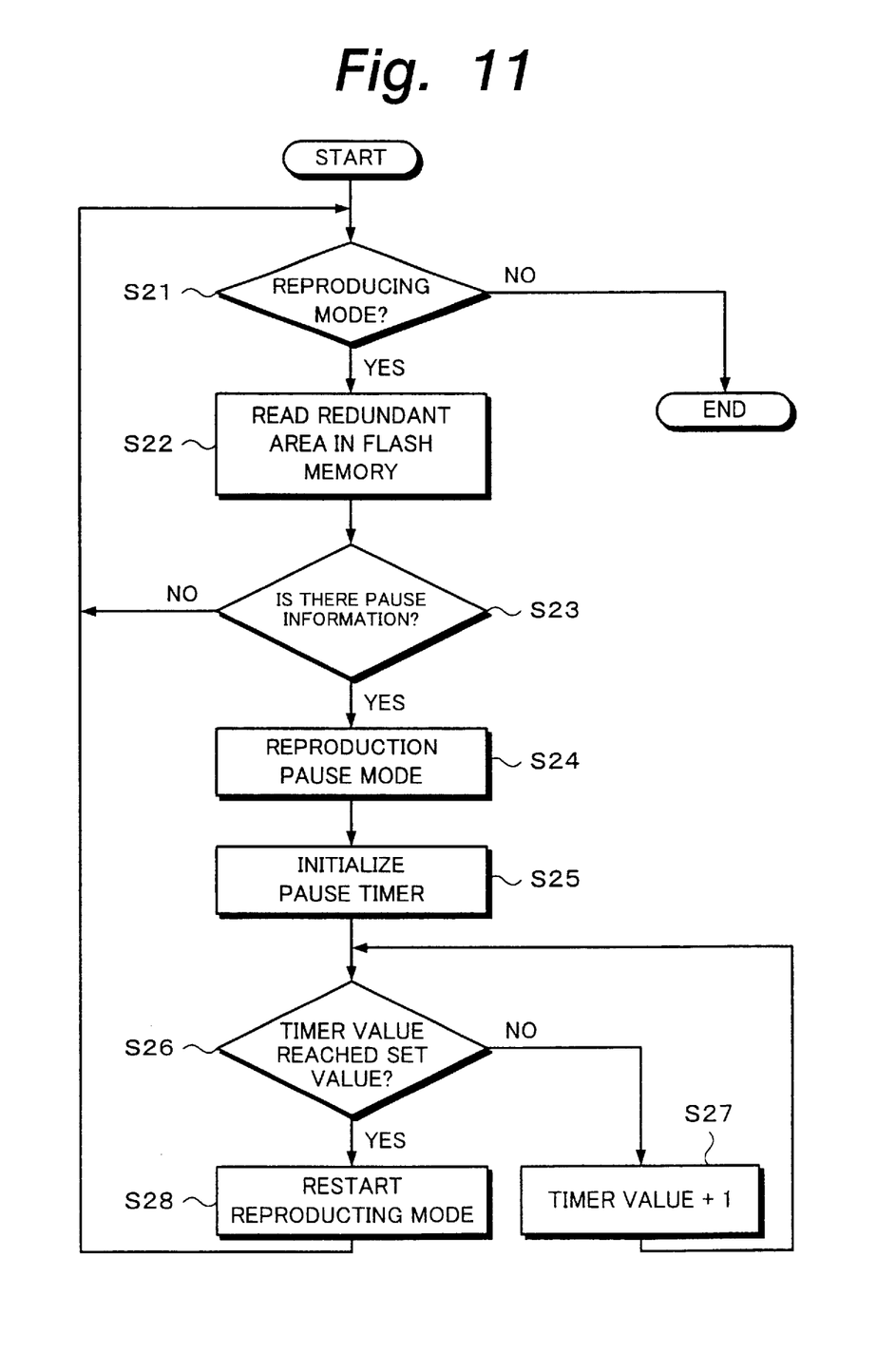
FIG. 11 is a flowchart for use in explanation of the operation to pause in the invention.

FIG. 11 shows an example of a processing procedure for the reproducing operation. In FIG. 11, the pause time information has been preset by the set buttons 23, 24, and 25 at a stage before the writing process of the pause information, and information corresponding to the set value is written as a part of the pause information into the redundant area 92 at the time of decision of the writing of the pause information as mentioned above. The pause time information which has already been written can be also changed by the set buttons 23 to 25 as necessary upon reproduction.

First, in step S21, whether the operating mode is the reproducing mode or not is discriminated. If it is decided in step S21 that the operating mode is not the reproducing mode, the processing routine is finished as it is. If it is decided in step S21 that the operating mode is the reproducing mode, the processing routine advances to step S22 and the data in the redundant area 92 in the extension memory 9 is read out. When the reading of the data in the redundant area 92 is completed, whether the pause information has been written or not is discriminated in step S23. If it is determined in step S23 that the pause information has been written, step S24 follows and a reproduction pause mode is set.

When the reproduction pause mode is set, first in step S25, a pause timer is initialized on the basis of the pause time information. After completion of the initialization of the pause timer, whether a timer value has reached a set value or not is discriminated in step S26. If it is determined in step S26 that the timer value does not reach the set value, the timer value is increased by "1" in step S27 and the processing routine is returned to step S26. The processes in steps S26 and S27 are repeated. Only when it is determined in step S26 that the timer value reached the set value, step S28 follows and the reproducing mode is restarted. The processing routine is returned to step S21. If it is decided again in step S21 that the operating mode is the reproducing mode, the processes in steps S22 to S28 are repeated. The processing routine is finished only when it is determined in step S21 that the operating mode is not the reproducing mode.

The invention is not limited to the reproduction only of the audio data. For example, in the case where image data and audio data have been recorded in the extension memory of the invention, it is also possible to construct the apparatus in such a manner that reproducing means of the image data is provided, for example, an image just before entering the silent period is displayed as a still image or predetermined image data is displayed for the silent period.

The invention is not limited to the memory as a recording medium but can be also applied to a magnetic disk or optical disk of the WORM type and/or recordable type such as a mini disc or the like.

Further, the invention can be also applied to data recorded on a non-WORM type recording medium such as a CD or the like by providing a rewritable recording medium or storage device separately from the recording medium. It is also possible to construct the apparatus in such a manner that the pause information is recorded or stored into the rewritable recording medium or storage device, and the pause information is read out from the rewritable recording medium or storage device, the operation is paused, or the pause information is written in response to the reading and reproduction of the data from the non-WORM type recording medium.

According to the invention, when a predetermined operation is performed for the operating means for writing the pause information, the information indicative of the presence or absence of the pause information is formed by the recording means at such a timing, the information formed by the recording means is written into the pause information storing means at a predetermined reproducing position, and upon reproducing operation, the pause information written in the pause information storing means is read out together with the main information. In the subsequent reproducing operation, therefore, the apparatus automatically enters the pause mode at the position where the pause information was written, and the reproduction is restarted after the elapse of the time which has previously and arbitrarily been set.

When a predetermined operation is performed for the operating means for erasing the pause information, the information to erase the pause information which is located in the back direction in the reproducing direction on the time base from the current reproducing position for such a timing and exists at the closest position is formed by the recording means, and the pause information written in the pause information storing means at the predetermined reproducing position is erased. According to the invention, therefore, the silent time of a desired duration can be easily and efficiently set to an arbitrary position in the recorded audio data and can be changed and the silent time can be also easily reset.

By applying the recording/reproducing apparatus according to the invention to the language learning apparatus or the like, the silent time of a desired duration can be easily and efficiently set to an arbitrary position in the recorded audio data and the learning can be also easily and repetitively performed.

The present invention is not limited to the foregoing embodiments but many modifications and variations are possible within the spirit and scope of the appended claims of the invention.

What is claimed is:

1. A recording/reproducing apparatus for reproducing main data which has been recorded on a recording medium and which is continuous with respect to time, comprising:

reproducing means for reproducing the main data recorded on said recording medium;

operating means, whereby a user sets pause position information indicative of a position where reproduction of said main data is paused and sets pause time information indicative of a pause continuation time at said pause position;

pause information forming means for forming said pause position information and said pause time information based on an operation of said operating means;

pause information recording means for recording said pause position information and said pause time information onto said recording medium;

timer means for counting a time to pause the reproduction of said main data; and control means for controlling said pause information recording means so that said pause position information and said pause time information which were formed by said pause information forming means based on the operation of said operating means are recorded onto said recording medium, controlling said timer means so as to count a continuation of the time to pause based on said pause time information and said pause position information and the position where said reproducing means is reproducing the main data, and for controlling said reproducing means so as to pause the reproduction of said main data for a period of time during which said timer means is counting the pause time.

2. The apparatus according to claim 1, wherein said pause position information and said pause time information are recorded on said recording medium as pause information.

3. The apparatus according to claim 1, further comprising end information recording means for recording onto said recording medium end information indicative of termination information and/or said pause time information for the main data recorded on said recording medium.

4. The apparatus according to claim 1, wherein when said pause time information reaches a predetermined value, the reproduction is continued.

5. The apparatus according to claim 1, further comprising position comparing means for comparing said pause position information with a reproducing position of the main data which is being reproduced by said reproducing means, and wherein said control means controls said reproducing means to pause based on a comparison result of said position comparing means.

6. The apparatus according to claim 1, wherein said operating means comprises first operating means and further comprising second operating means for allowing a user to arbitrarily change said pause time information.

7. The apparatus according to claim 1, wherein said control means controls said reproducing means so that when said pause position information is formed by said pause information forming means, the main data recorded on said recording medium at a position near said pause position information is repetitively reproduced.

8. The apparatus according to claim 7, wherein said operating means comprises first operating means and further comprising second operating means for allowing a user to correct said pause position information during said repetitive reproduction.

9. The apparatus according to claim 1, wherein said operating means comprises first operating means and further comprising second operating means for allowing a user to erase said pause position information and said pause time information.

10. The apparatus according to claim 9, further comprising extracting means for extracting said pause position information set at a point near a time point designated by said second operating means from said recording medium, and wherein said control means erases said pause position information based on an extraction result of said extracting means.

11. The apparatus according to claim 10, wherein said control means erases the pause time information associated with said pause position information to be erased.

12. The apparatus according to claim 11, wherein said pause position information existing at a position preceding said designated point in a time sequence is erased from said pause position information extracted by said extracting means.

13. The apparatus according to claim 9, wherein when an erasing instruction of said pause position information is issued from said second operating means during the pause based on said pause position information, said pause information to instruct said pause is erased.

14. A recording/reproducing method for reproduction of main data recorded on a recording medium so as to be continuous with respect to time, the method comprising the steps of:

forming pause position information indicative of a position to pause the reproduction of said main data based on an operation of a user;

forming a time, as pause time information, to pause the reproduction of said main data at a position corresponding to said formed pause position information on the basis of an operation of the user;

storing said formed pause position information and said formed pause time information onto said recording medium; and reproducing said main data and pausing the reproduction of said main data for a predetermined period of time based on said pause position information and said pause time information recorded on said recording medium.

15. The method according to claim 14, further comprising the step of recording onto the recording medium end information indicative of termination information for the main data recorded on said recording medium.

16. The method according to claim 14, wherein when said pause time information reaches a predetermined value, the reproduction is continued.

17. The method according to claim 14, further comprising the step of comparing said pause position information with a reproducing position of the main data which is being reproduced, and wherein the reproduction of said main data is paused based on a comparison result in said step of comparing.

18. The method according to claim 17, wherein when the comparison result indicates a coincidence in said step of comparing, the reproduction of said main data is paused for a period of time based on said pause time information.

19. The method according to claim 14, further comprising the step of editing said pause time information based on an operation of the user.

20. The method according to claim 14, wherein in said step of forming said pause position information based on the operation of the user, the main data recorded on said recording medium at a position near said formed pause position information is repetitively reproduced.

21. The method according to claim 20, further comprising the step of correcting said pause position information based on an operation of the user during said repetitive reproduction.

22. The method according to claim 14, further comprising the step of erasing said pause position information and/or said pause time information based on an operation of the user.

23. The method according to claim 22, further comprising the step of extracting from said recording medium said pause position information set at a point near a time point designated based on said operation of the user, and wherein said pause position information is erased based on a result of said extraction.

24. The method according to claim 23, wherein said pause position information said designated point in a time sequence is erased from said extracted pause position information.

25. The method according to claim 22, wherein when an erasing instruction of said pause position information is issued by the user during the pause based on said pause position information, said pause position information to instruct said pause is erased.

* * * * *